United States Patent [19]

Rogers et al.

[11] Patent Number: 5,376,829
[45] Date of Patent: Dec. 27, 1994

[54] HIGH-SPEED COMPLEMENTARY MULTIPLEXER

[75] Inventors: Alan C. Rogers, Palo Alto; Donald L. Sollars, Milpitas, both of Calif.

[73] Assignee: Sun Microsystems, Inc., Mountain View, Calif.

[21] Appl. No.: 119,961

[22] Filed: Sep. 10, 1993

[51] Int. Cl.⁵ .............................................. H03K 17/56
[52] U.S. Cl. .................................. 327/408; 327/362
[58] Field of Search ............... 307/241, 243, 570, 572, 307/584, 588, 491; 328/104, 154

[56] References Cited

U.S. PATENT DOCUMENTS

| | | | |
|---|---|---|---|
| 3,739,193 | 6/1973 | Pryor | 307/243 |
| 4,424,460 | 1/1984 | Best | 307/243 |
| 4,567,385 | 1/1986 | Falater et al. | 307/243 |
| 5,070,255 | 12/1991 | Shin | 307/243 |
| 5,111,077 | 5/1992 | Young et al. | 307/570 |
| 5,113,096 | 5/1992 | Lev et al. | 307/570 |
| 5,155,387 | 10/1992 | Fletcher et al. | 307/570 |
| 5,162,666 | 11/1992 | Tran | 307/243 |
| 5,233,233 | 8/1993 | Inoue et al. | 307/243 |

OTHER PUBLICATIONS

IBM Technical Disclosure Bulletin, vol. 24, No. 4, Sep. 1981.

Primary Examiner—Timothy P. Callahan
Assistant Examiner—T. T. Lam
Attorney, Agent, or Firm—Blakely Sokoloff Taylor & Zafman

[57] ABSTRACT

The complementary multiplexer includes a first pass-gate, formed from a single PMOS transistor, and a second pass-gate formed from a single NMOS transistor. The gates of the PMOS and NMOS transistors are connected directly to a select input line. No inversion of the select input signal is required. A compensation circuit is connected to outputs of the pass-gates for compensating any voltage differences between signals received through the first pass-gate as opposed to those received through the second pass-gate. Full CMOS and bi-CMOS implementations are described herein. An exclusive OR-gate circuit, incorporating a bi-CMOS implementation of the multiplexer, is also described herein.

8 Claims, 5 Drawing Sheets

HIGH-SPEED COMPLEMENTARY MULTIPLEXER

BACKGROUND OF THE INVENTION

1. Field of the Invention

The invention generally relates to integrated circuit components and, in particular, to two-input multiplexers.

2. Description of Related Art

Two-input multiplexers are in common use in a wide variety of integrated circuits. A simple two-input multiplexer 10 is illustrated in FIG. 1. Multiplexer 10 of FIG. 1 receives a pair of input signals d0 and d1 along input lines 12 and 14 respectively. Multiplexer 10 also receives an input select signal along a select line 16 which designates either the d0 input or the d1 input. Multiplexer 10 operates to transmit a single output signal which corresponds to either the d0 signal or the d1 signal depending upon the value of the select signal. To this end, multiplexer 10 includes a pair of NMOS transistors, 18 and 20, and a pair of inverters 22 and 24. A gate of NMOS transistor 18 is connected to select line 16. A gate of NMOS transistor 20 is connected through inverter 22 to select line 16. NMOS transistor 18 has an input connected to input line 12 whereas NMOS transistor 20 has an input connected to input line 14. With this configuration, either transistor 18 or transistor 20, but not both, pass the input signal. The resulting signal is inverted by inverter 24 and output along an output line 26.

Transistors 18 and 20 are herein referred to as pass-gates. As can be seen from FIG. 1, pass-gates 18 and 20 are "equal", i.e., pass-gates 18 and 20 are both NMOS transistors. Because equal pass-gates are employed, the select signal must be inverted prior to transmission to one of the two NMOS transistors. Hence, inverter 22 is required. Although multiplexer 10 is effective for selecting between the two input signals d0 and d1, the need to provide an inverter results in an additional delay before the output signal can be provided. Hence, the multiplexer configuration of FIG. 1 is not ideal for applications requiring high speed switching wherein the additional delay caused by the requirement that the select signal be inverted is undesirable.

FIG. 2 illustrates a somewhat more sophisticated multiplexer 30. Multiplexer 30 of FIG. 2 is referred to as a complementary multiplexer with each of a pair of pass-gates including both a PMOS and an NMOS transistor. Input signals d0 and d1 are received along input lines 32 and 34 respectively. A select input signal is received along line 36. A first pass-gate 38 and a second pass-gate 40 are connected to input lines 32 and 34 respectively. Pass-gate 38 includes an NMOS transistor 39 and a PMOS transistor 41. A gate of NMOS transistor 39 is connected to select line 36. A gate of PMOS transistor 41 is connected through an inverter 42 to select line 36. Second pass-gate 40 likewise includes a PMOS transistor and an NMOS transistor denoted 43 and 45 respectively. However, for pass-gate 40, a gate of PMOS transistor 43 is connected directly to input select line 36 with the gate of NMOS transistor 45 connected through inverter 42 to select line 36. Hence, the configuration of pass-gate 40 is reversed from that of pass-gate 48. Output signals from the pair of pass-gates are connected through an output inverter 44 for transmission along an output line 46.

The complementary multiplexer of FIG. 2 has advantages over the simple multiplexer of FIG. 1, particularly as far as providing a buffered, stable output. However, as with the simple multiplexer of FIG. 1, the complementary multiplexer of FIG. 2 requires that the input select signal be inverted. The necessity of inverting the input select signal causes an additional time delay which is undesirable for high-speed circuitry.

SUMMARY OF THE INVENTION

From the foregoing, it can be appreciated that it would be desirable to provide an improved two-input multiplexer and, in particular, an improved multiplexer which does not require the inversion of an input select signal. One of the general objects of the invention is to provide such an improved multiplexer.

This general object, and other general objects and advantages of the invention, are achieved by the provision of a multiplexer having:

a first pass-gate means connected directly to a first input line and to a select line, for passing a signal received along a first input line only if the select signal is in a first state;

a second pass-gate means connected directly to a second input line and to the select line, for passing a signal received along the second input line only if the select signal is in a second state; and compensation means, connected to outputs of the first and second pass-gates, for receiving a signal from either the first pass-gate or from the second pass-gate and for generating a scaled output signal with the output signal being comprised of a pair of voltage levels which are substantially unaffected by whether a signal is received from the first pass-gate or from the second pass-gate.

In the preferred embodiment, the first pass-gate includes a single PMOS transistor having a gate connected directly to the select input line and the second pass-gate includes a single NMOS transistor having a gate also connected directly to the select input line. The compensation means includes a second PMOS transistor and second, third and forth NMOS transistors. The second PMOS transistor has a gate connected to an output of the input PMOS transistor. Source connected to a high voltage level, and drain connected to an output line. The second NMOS transistor has a gate connected to an output of the input NMOS transistor, a source connected to a ground and a drain connected to an output line. The third NMOS transistor has a gate connected to the select input line, a drain connected to the output line, and a source. The fourth NMOS transistor has a gate connected to the second input line, a source connected to a ground and a drain connected to the source of the third NMOS transistor. A line is provided which interconnects the output of the input PMOS transistor and the output of the input NMOS transistor. The sizes of the various transistors are selected to properly scale signals output by the input PMOS and NMOS transistors to compensate for any voltage level differences between signals received from the input PMOS transistor as opposed to signals received from the input NMOS transistor.

In an alternative embodiment, the compensation means is constructed using a bi-CMOS implementation.

Also in accordance with the invention, a method is provided for achieving two-input multiplexing. The method comprises the steps of:

receiving first and second input signals on first and second input lines, respectively;

receiving a select signal along a select input line;

passing the first input signal through a first pass-gate, if the select signal is in a first state;

passing the second input signal through a second pass-gate, if the select signal is in a second state; and scaling the signal passed through one of the first and second pass-gates to between first and second voltage levels with the first and second voltage levels being substantially unaffected by whether the signal is received through the first pass-gate or through the second pass-gate.

The method operates to multiplex the pair of signals received through complementary pass-gates by appropriately scaling the signals transmitted through the pass-gates to compensate for any voltage differences. The method may be employed using the apparatus as summarized above or by using other appropriate circuits, devices, and the like.

In its various embodiments, the invention achieves two-input multiplexing without requiring an inversion of a select input signal. Accordingly, any additional time-delay required by the inversion is not incurred. More specifically, the requirement that the select signal be inverted is eliminated by providing a second stage compensation means for compensating any voltage level differences between signals received from the first pass-gate or from the second pass-gate. Other advantages of the invention will be apparent from the detailed description of the invention set forth below.

DETAILED DESCRIPTION OF THE INVENTION

Figure 3:
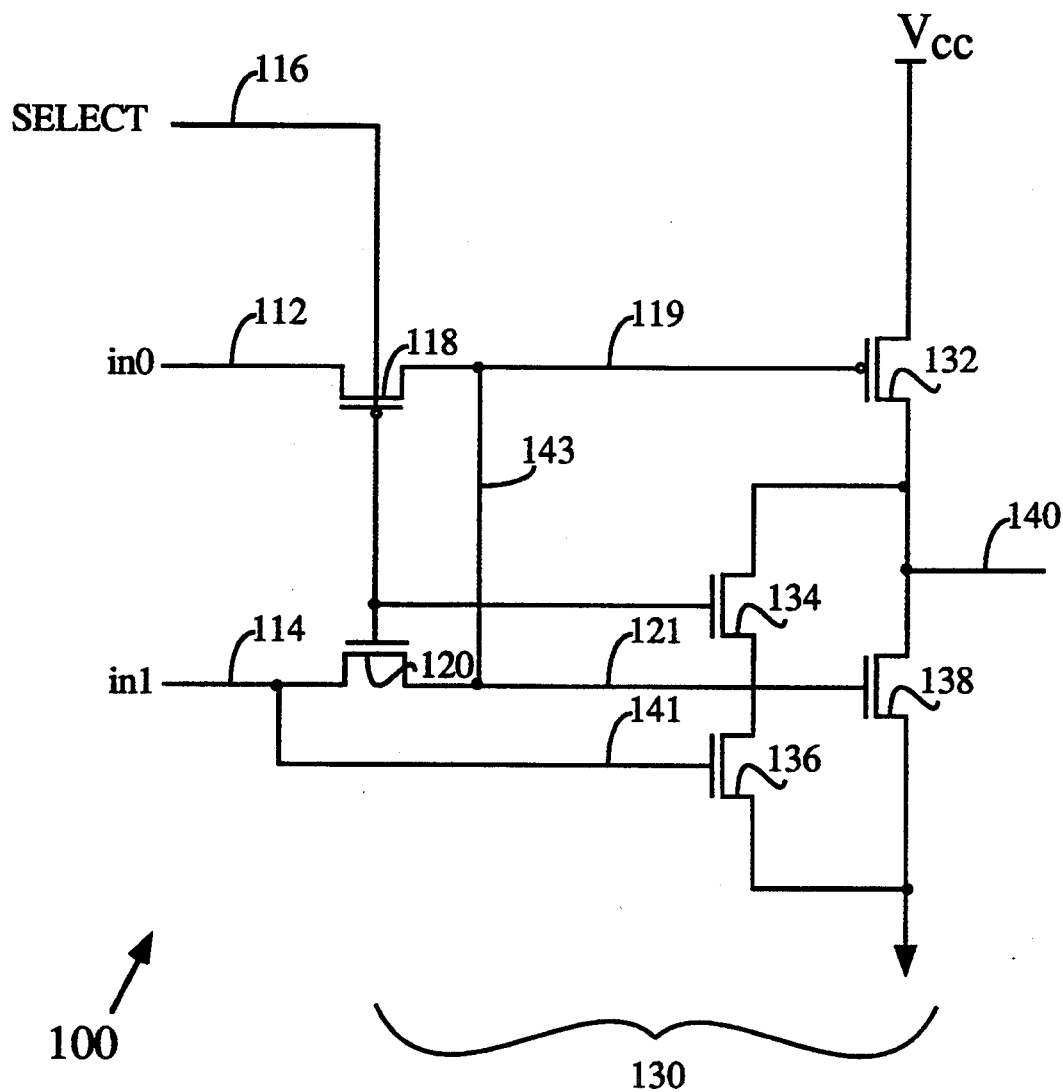
FIG. 3 is a schematic illustration of an improved two-input multiplexer configured in accordance with a preferred embodiment of the invention.
Figure 4:
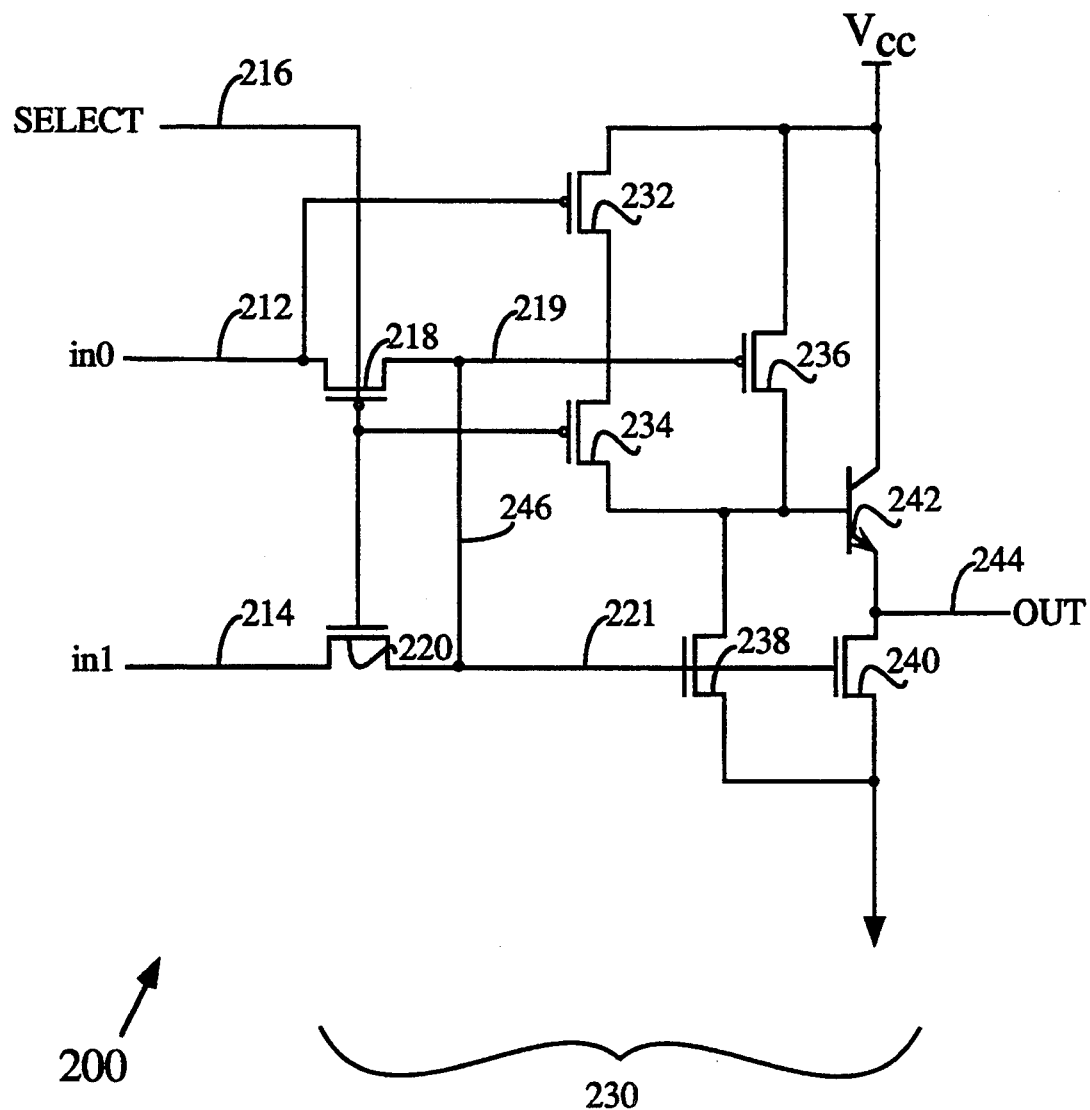
FIG. 4 is an alternative embodiment of the two input multiplexer of FIG. 3, having a bi-CMOS implementation.
Figure 5:
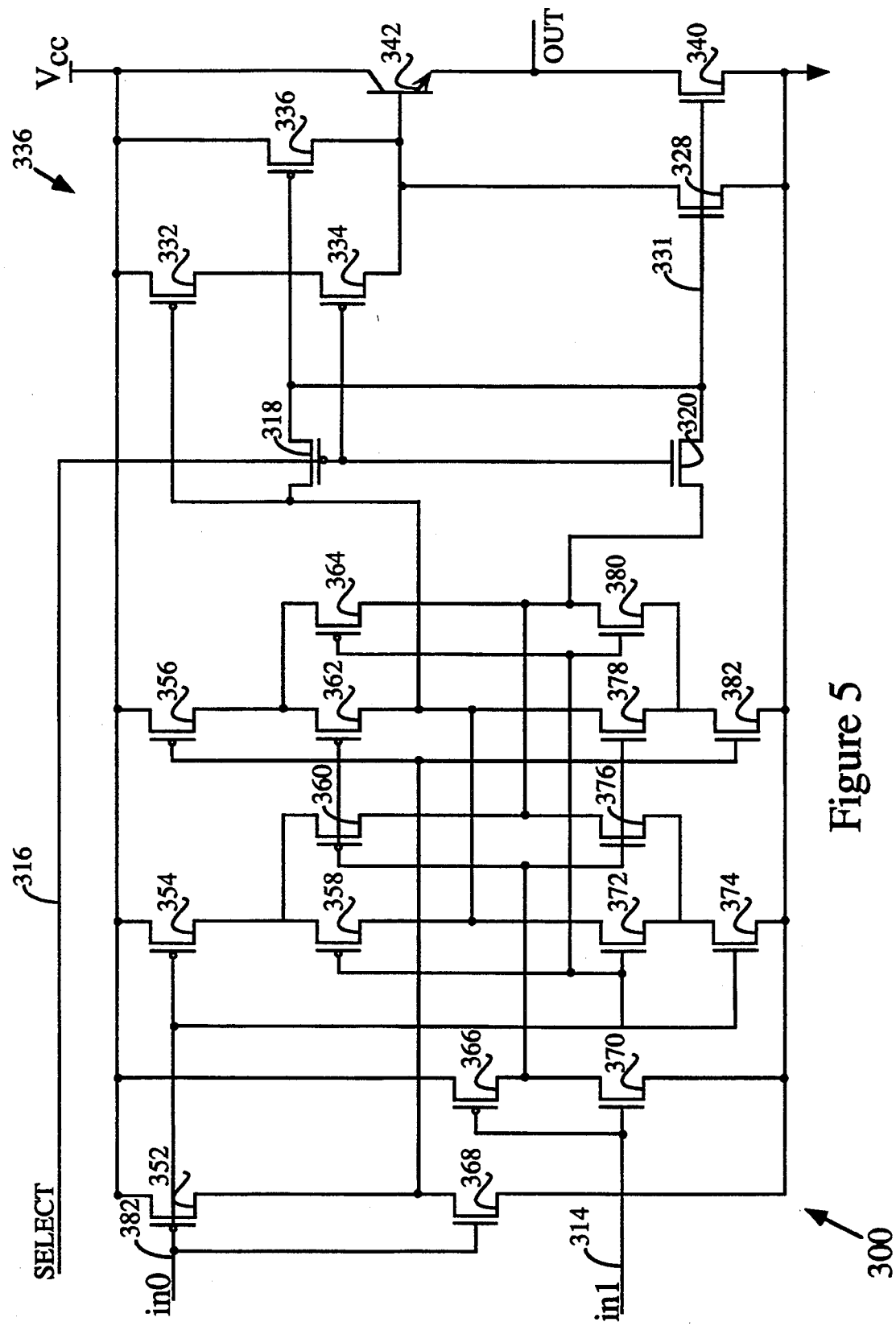
FIG. 5 is a schematic illustration of a three-input exclusive OR-gate incorporating the improved multiplexer of FIG. 3.

Referring to FIGS. 3–5, preferred apparatus embodiments of the invention will now be described. FIG. 3 illustrates an improved two-input multiplexer 100, configured entirely using CMOS transistors. Multiplexer 100 of FIG. 3 receives a pair of input signals in0 and in1 along input lines 112 and 114, respectively. A select input signal is received along an input line 116. A first pass-gate is connected directly to input line 112 and select line 116. The first pass-gate includes a single PMOS transistor 118. A gate of the PMOS transistor is connected to select line 116. A source of PMOS transistor 118 is connected to input line 112 and a drain of PMOS transistor 118 is connected to an intermediate line 119. A second pass-gate is provided which includes a single NMOS transistor 120. NMOS transistor 120 has a gate connected to select line 116, a source connected to input line 114 and a drain connected to a second intermediate line 121.

Figure 1:
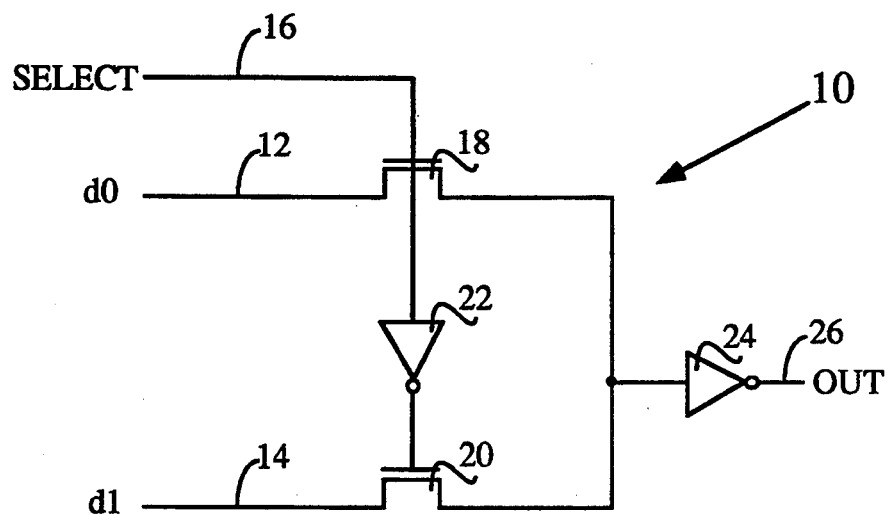
FIG. 1 is a schematic illustration of a prior art two-input multiplexer having two equal pass-gates.
Figure 2:
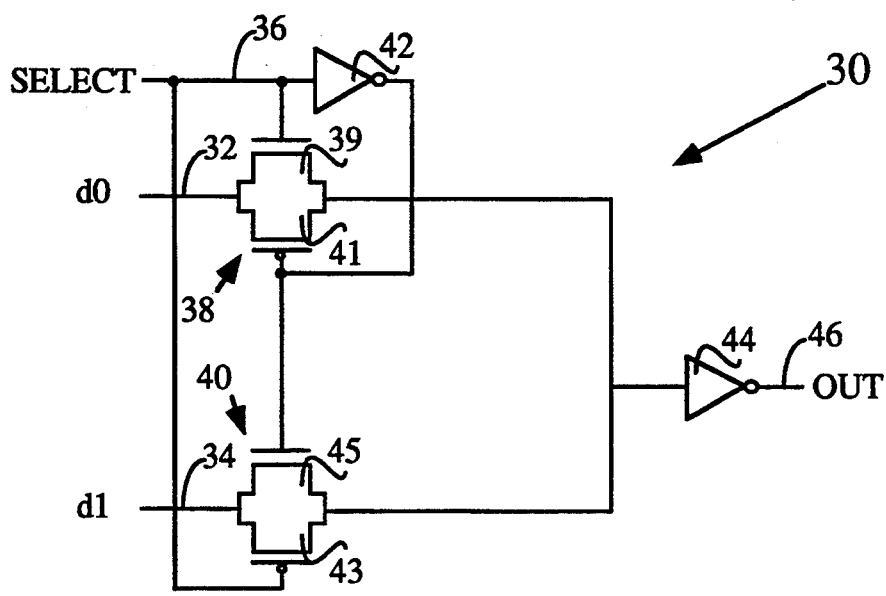
FIG. 2 is a schematic illustration of a prior art two-input multiplexer having a pair of complementary pass-gates.

Thus, a pair of pass-gates are provided with each pass-gate including only a single transistor. Each of the two pass-gates directly receives the select input signal without any inversion of the select signal required. The need to invert the select signal is eliminated because one of the pass-gates is a PMOS transistor and the other is an NMOS transistor. Accordingly, a single uninverted select signal, applied to respective gates of the two transistors, operates to selectively control operation of the two gates such that only one of the gates is open at any time. This is in contrast to the prior art multiplexers shown in FIGS. 1 and 2 wherein an inverter must be provided along the select input line for inverting the signal applied to either one or both of a pair of pass-gates.

Considering the operation of the pass-gates of FIG. 3 in more detail, each receives an input signal composed one of two logic voltage levels, typically a HIGH level of $V_{cc}$ and a LOW level of $V_{ss}$. The select signal of select line 116 is likewise defined by one of two logic states, a HIGH voltage level and a LOW voltage level. When the select signal is LOW, PMOS transistor 118 becomes active and input signals received along line 112 are transmitted onto intermediate line 119. When select signal is HIGH, NMOS transistor 120 becomes active and input signals received along line 114 are transmitted to intermediate line 121. Because intermediate line 119 is connected to a PMOS transistor, whereas intermediate line 121 is connected to an NMOS transistor, the logic signal levels on the intermediate lines differ. Thus, whereas the input signals are set to either HIGH or LOW, the intermediate signals applied to lines 119 and 121 may have voltages differing from HIGH and LOW.

To provide a consistent output signal defined by a pair of logic values which do not differ depending upon whether a signal is received from input line 112 or input line 114, a compensation circuit, generally denoted 130, is provided for scaling the output signals from PMOS transistor 118 and NMOS transistor 120. Compensation circuit 130 includes a single PMOS transistor 132 and three NMOS transistors 134, 136 and 138. PMOS transistor 132 has a gate connected through intermediate line 119 to an output of PMOS transistor 118, a source connected to a high voltage level of $V_{cc}$, and a drain connected to an output line 140. NMOS transistor 134 has a gate connected to select line 116, a drain connected to output line 140 and a source connected to a drain of NMOS transistor 136. A gate of NMOS transistor 136 is connected directly to input line 114 and a source of transistor 136 is connected to a ground. Direct connection of the gate of NMOS transistor 136 to input line 114 is achieved by a bypass line 141 which allows an input signal received along input line 114 to bypass input NMOS transistor 120 for directly controlling NMOS transistor 136. NMOS transistor 138 has a gate connected to intermediate line 121 for receiving an output signal from input NMOS transistor 120. A source of NMOS transistor 138 is connected to a ground. A drain of NMOS transistor 138 is connected directly to output line 140.

In addition to the foregoing interconnections, a cross-bar line 143 is connected between intermediate lines 119 and 121. With the provision of cross-bar line 143, an output signal from PMOS transistor 118 is split onto two lines and applied to the gates of both PMOS transistor 132 and NMOS transistor 138. Likewise, an output signal from input NMOS transistor 120 is split onto a pair of lines and applied to the gates of PMOS transistor 132 and NMOS transistor 138. Hence, regardless of the value of select input line 116, PMOS transistor 132 and NMOS transistor 138 both receive input signals. Whether those signals are received from PMOS transistor 118 or NMOS transistor 120 is determined by the value of the select signal. NMOS transistor 134 always receives the select input signal and NMOS transistor 136 always receives the in1 input signal from input line 114. With these interconnections, the output signal applied to output line 140 corresponds either to in0 or in1, depending upon the value of the select input signal. It should be noted that the output signals of pass-gates 118 and 120 are applied only to the gates of various transistors which are connected in series or in parallel between high voltage $V_{cc}$ and a ground. In other words, the output signal is completely buffered from any of the input signals.

Thus, when the select signal is LOW, the output signal corresponds to in0. When the select signal is HIGH the output signal corresponds to in1. Furthermore, the output signal is composed of HIGH and LOW signals having voltages of $V_{cc}$ and $V_{ss}$, respectively. Any differences in signal voltages output from PMOS transistor 118 in comparison with NMOS transistor 120 are compensated by compensation circuit 130. More specifically, compensation is achieved by selecting appropriate values for the sizes of various NMOS and PMOS transistors illustrated in FIG. 3. TABLE I provides exemplary values for the various transistors, which have been found to work effectively. The transistor sizes in Table I are provided as channel ratio values, i.e., channel width over channel length.

TABLE I

| PMOS Transistor 118 | 20/.8 |
|---|---|
| NMOS Transistor 120 | 20/.8 |
| PMOS Transistor 132 | 30/.8 |
| NMOS Transistor 134 | 50/.8 |
| NMOS Transistor 136 | 50/.8 |
| NMOS Transistor 138 | 5/.8 |

Although the channel ratio values listed in TABLE I provide an effective set of transistor sizes for achieving adequate compensation of signals output by PMOS transistor 118 and NMOS transistor 120, other transistor sizes may also be effective with those alternative sizes determined by those skilled in the art in light of the teachings of the present invention. Furthermore, alternative configurations may be provided for compensation circuitry 130 to also achieve adequate compensation of differences in the signals output by PMOS transistor 118 and NMOS transistor 120.

An example of an alternative configuration for the overall multiplexer, in general, and for the compensation circuitry, in particular, is provided in FIG. 4. FIG. 4 illustrates a bi-CMOS implementation of the multiplexer. Multiplexer 200 of FIG. 4 receives input signals along lines 212 and 214 and a select signal along an input line 216. As with the embodiment of FIG. 3, a pair of pass-gates are provided with each pass-gate having only a single transistor, with a first pass-gate including a single PMOS transistor 218 and a second pass-gate including a single NMOS transistor 220. An output signal from PMOS transistor 218 is asserted onto an intermediate line 219. An output signal from NMOS transistor 220 is asserted onto a second intermediate line 221. Thus far, the structure of FIG. 4 is identical to that of FIG. 3, although differing values may be selected for the input PMOS and NMOS transistors. However, in the bi-CMOS implementation of FIG. 4, a compensation circuit 230 is provided which differs in architecture from the compensation circuit of FIG. 3.

Compensation circuit 230 includes three PMOS transistors 232, 234 and 236 and a pair of NMOS transistors 238 and 240. Finally, a single bipolar transistor 242 is provided. The various transistors of compensation circuit 230 are configured in the following manner. A gate of PMOS transistor 232 is connected directly to input line 212. A source of PMOS transistor 232 is connected to a high voltage level, preferably $V_{cc}$. A gate of PMOS transistor 234 is connected directly into select input line 216. PMOS transistor 234 has a source connected to a drain of PMOS transistor 232 and has a drain connected to a base of bipolar transistor 242. PMOS transistor 236 has a gate connected to an output of input of PMOS transistor 218 via intermediate line 219. A source of PMOS transistor 236 is connected to high voltage $V_{cc}$ and a drain of PMOS transistor 236 is connected to the base of bipolar transistor 242. NMOS transistor 238 has a gate connected to intermediate line 221, a source connected to a ground and a drain connected to the base of bipolar transistor 242. NMOS transistor 240 has a gate connected to intermediate line 221, a source connected to a ground and a drain connected to an output line 244. Finally, a collector of bipolar transistor 242 is connected to high voltage $V_{cc}$ and an emitter thereof is connected to output line 244. In addition to the foregoing interconnections, a cross-bar line 246 interconnects intermediate lines 219 and 221.

With the foregoing interconnections, and with appropriate choice of the sizes of the various transistors, an input signal selected by the select signal is output along output line 244. Any differences in the logic voltage level output from input PMOS transistor 218 and input NMOS transistor 220 are fully compensated by compensation circuit 230. As with the full CMOS implementation described above, the bi-CMOS implementation may be configured in a number of ways to achieve adequate compensation with the various sizes of the transistors selected accordingly. Exemplary transistor sizes are provided in TABLE II below.

TABLE II

| PMOS Transistor 218 | 13/.8 |
|---|---|
| NMOS Transistor 220 | 11/.8 |
| PMOS Transistor 232 | 23/.8 |
| PMOS Transistor 234 | 23/.8 |
| PMOS Transistor 236 | 17/.8 |
| NMOS Transistor 238 | 5/.8 |
| NMOS Transistor 240 | 25/.8 |
| Bipolar Transistor 242 | 2.56 |

As with the full CMOS implementation, it should be noted that the output signals of the pass-gates are applied to the gates of transistors connected in series or in parallel between high voltage $V_{cc}$ and a ground, such that the output signal is completely buffered from any of the input signals. The bi-CMOS implementation provides more drive and lower leakage for a given input loading than a full CMOS implementation, resulting in higher speeds in many applications.

Whether implemented as a full CMOS multiplexer or a bi-CMOS multiplexer, the multiplexer of the invention provides for high-speed multiplexing of the input signals. As noted above, no inversion of the input select signal is required. Accordingly, the time delay which is inherent in any inverter used to invert the select signal, is not incurred in these implementations. Thus, the overall multiplexing operation occurs faster and is better suited for high speed logic operations wherein an additional delay may unduly degrade performance.

The two-input multiplexer of FIG. 4 is well suited for use as a component of a three-input exclusive OR-gate, which may, itself, form a component of an adder. FIG. 5 illustrates an implementation of a three-input exclusive OR-gate 300 which includes, as a component, the bi-CMOS multiplexer of FIG. 4. However, additional transistors and interconnection circuitry are provided in advance of the input stages of the bi-CMOS multiplexer, to provide a high-speed exclusive OR-logic capability. The input stage of exclusive OR-gate 300 includes eight PMOS transistors labeled 352, 354, ..., 366. Also included are eight NMOS transistors labeled 368, 370, ..., 382. The multiplexer portion of OR-gate 300 is substantially as described above with reference to FIG. 4 and like reference numerals are employed, incremented by 100. The various PMOS and NMOS transistors for OR-gate 300 are interconnected as shown in FIG. 5. For clarity and brevity, the details of these interconnections will not be described herein. In general, however, it is worth noting that the circuit is such that an output signal generated by a PMOS portion of the input stage is asserted onto PMOS pass-gate 318 whereas an NMOS signal is asserted onto NMOS input pass-gate 320. The input stage of the OR-gate receives input signals in0 and in1 and converts those input signals to intermediate signals which, when applied to multiplexer portion 310, yields an exclusive OR-gate output. The sizes of the various transistors are preferably selected to achieve proper logic operations and to yield an output signal which is fully buffered. TABLE III provides a list of exemplary transistor sizes for the transistors illustrated in FIG. 5.

TABLE III

| PMOS Transistor 318 | 13/.8 |
|---|---|
| NMOS Transistor 320 | 11/.8 |
| PMOS Transistor 332 | 23/.8 |
| PMOS Transistor 334 | 23/.8 |
| PMOS Transistor 336 | 17/.8 |
| NMOS Transistor 338 | 5/.8 |
| NMOS Transistor 340 | 25/.8 |
| Bipolar Transistor 342 | 2.56 |
| PMOS Transistor 332 | 25/.8 |
| PMOS Transistor 354 | 35/.8 |
| PMOS Transistor 356 | 35/.8 |
| PMOS Transistor 358 | 25/.8 |
| PMOS Transistor 360 | 8/.8 |
| PMOS Transistor 362 | 25/.8 |
| PMOS Transistor 364 | 8/.8 |
| PMOS Transistor 366 | 25/.8 |
| NMOS Transistor 368 | 12/.8 |
| NMOS Transistor 370 | 12/.8 |
| NMOS Transistor 372 | 12/.8 |
| NMOS Transistor 374 | 25/.8 |
| NMOS Transistor 376 | 12/.8 |
| NMOS Transistor 378 | 12/.8 |
| NMOS Transistor 380 | 12/.8 |
| NMOS Transistor 382 | 25/.8 |

By employing the compensation architecture, described above, the output signal is fully compensated for any voltage differences resulting from using a single PMOS transistor and a single NMOS transistor as multiplexer pass-gates. Also, as with the multiplexer-only embodiments described above, no inverters are required in the select path of exclusive OR-gate of FIG. 5. Hence a high-speed exclusive OR-logic capability is achieved, which is ideally suited for use in high-speed circuitry.

The exclusive OR-gate of FIG. 5 may itself be a component of an adder, the details of which are not shown.

The various circuits described herein can be fabricated using conventional CMOS or bi-CMOS fabrication technology, the details of which will not be provided herein. As noted, the multiplexer, and logic gates formed therefrom, are well suited for use in very high frequency integrated circuit applications.

Figure 6:
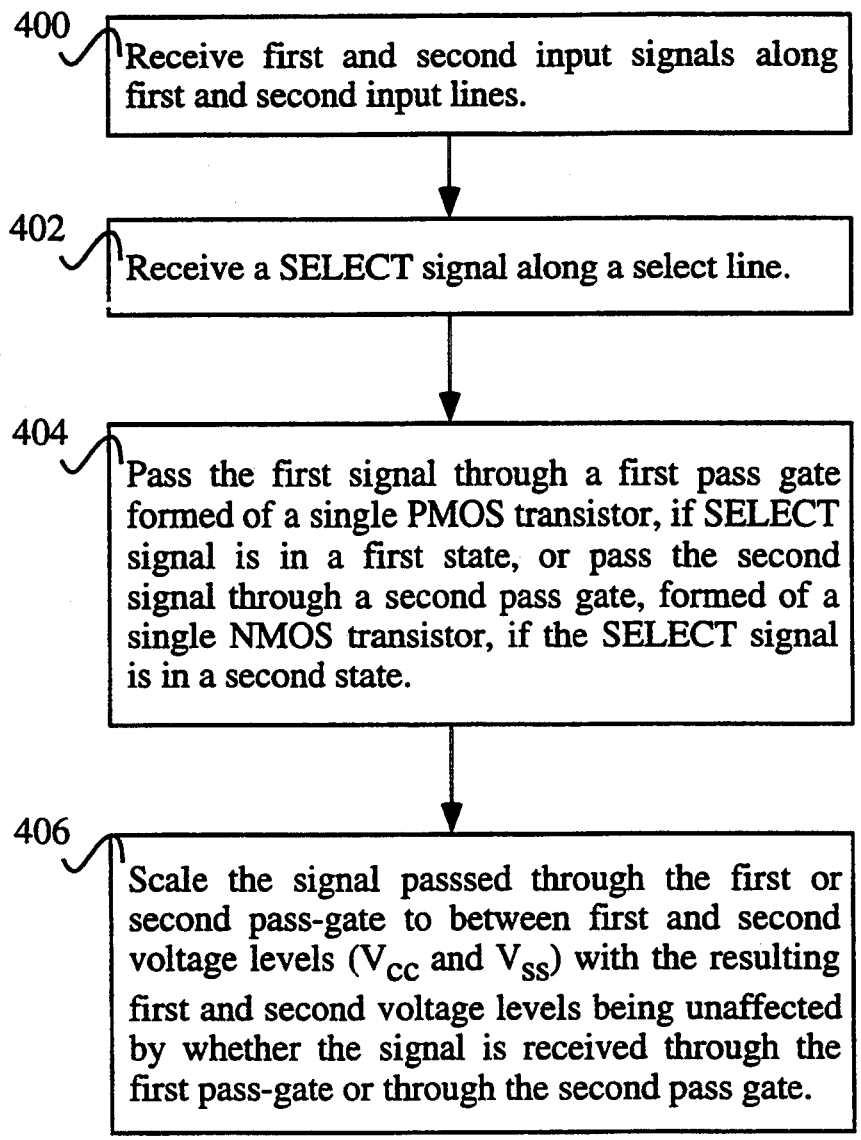
FIG. 6 is a flow chart illustrating a method of performing two-input multiplexing, in accordance with the invention.

Referring to FIG. 6, a preferred method embodiment of the invention will now be described. FIG. 6 provides a flow chart illustrating a multiplexing method which can be performed using the circuitry described above in FIGS. 3–5, or by using other appropriate circuitry, devices and the like. At step 400, first and second input signals are received along first and second input lines respectively. A select signal is received along a select input line at step 402. At 404, the first input signal is passed through a first pass-gate, only if the select signal is in a first state or the second input signal is passed through a second pass-gate, only if the select signal is in a second state. At 406, the signal passed through one of the first and second pass-gates is scaled to between first and second voltage levels with the resulting first and second voltage levels being substantially unaffected by whether the signal is received through the first pass-gate or through the second pass-gate.

What has been described is a method and apparatus for multiplexing a pair of input signals to generate a single output signal. Multiplexing is achieved using a pair of complementary pass-gates but without requiring an inversion of an input select signal. By eliminating the need to invert the select signal, any additional delay caused by the inversion is eliminated, thus providing for faster multiplexing. As such, the invention is advantageously applied in a variety of applications requiring high-speed multiplexing. Although the invention is described with respect to exemplary embodiments, these embodiments are merely illustrative of the general principles of the invention and do not limit the scope of the invention.

What is claimed is:

1. A multiplexer, comprising:
    a PMOS pass-gate having a first threshold voltage connected to a first input line, an output, and a select line, for passing a first input signal received along said first input line, said first input signal received along said first input line being passed by said PMOS pass-gate only if a select signal received along said select line is in a first state;
    an NMOS pass-gate having a second threshold voltage, connected to a second input line, an output and said select line, for passing a second input signal received along said second input line, said second input signal received along said second input line being passed by said NMOS pass-gate only if said select signal received along said select line is in a second state; and
    a compensation unit, connected to outputs of said PMOS and NMOS pass-gates, for receiving a signal passed through one of said pass-gates and for compensating for said threshold voltage differences between said PMOS and NMOS pass-gates such that a range of output voltages provided by said multiplexer is substantially unaffected by whether said signal is passed through said PMOS pass-gate or through said NMOS pass-gate.

2. The multiplexer of claim 1, wherein said PMOS pass-gate comprises a first PMOS transistor, having a gate connected to said select line, for passing said first input signal in response to a low voltage signal received along said select line; and wherein said NMOS pass-gate comprises a first NMOS transistor, having a gate connected to said select line, for passing said second input signal in response to a high voltage signal received along said select line.

3. The multiplexer of claim 2, wherein said compensation unit comprises:

a second PMOS transistor having a gate connected to said output of said first PMOS transistor, a source connected to a high voltage level, and a drain connected to an output line;

a second NMOS transistor having a gate connected to said output of said first NMOS transistor, a source connected to a ground, and a drain connected to said output line;

a third NMOS transistor having a gate connected to said select input line, a drain connected to said output line; and a source;

a fourth NMOS transistor having a gate connected to said second input line, a source connected to a ground, and a drain connected to said source of said third NMOS transistor; and a line interconnecting said output of said first PMOS transistor and said output of said first NMOS transistor.

4. The multiplexer of claim 2, wherein said compensation unit comprises:

a second PMOS transistor having a gate connected to said first input line, a source connected to a high voltage source, and a drain;

a third PMOS transistor having a gate connected to said select input line, a source connected to said drain of said second PMOS transistor, and a drain;

a fourth PMOS transistor having a gate connected to an output of said first PMOS transistor, a source connected to said high voltage source, and a drain;

a bipolar transistor, having a collector connected to said high voltage source, a base connected to said drains of said third and fourth PMOS transistors, and an emitter connected to an output line;

a second NMOS transistor having a gate connected to an output of said first NMOS transistor, a source connected to a ground, and a drain connected to said drains of said third and fourth PMOS transistors; and a third NMOS transistor having a source connected to a ground, a gate connected to said output of said first NMOS transistor, and a drain connected to an output line.

5. A method for multiplexing signals, said method comprising the steps of:

receiving first and second input signals on first and second input lines, respectively;

receiving a select signal along a select input line;

passing the first input signal through a PMOS pass-gate having a first threshold voltage, only if the select signal is in a first state;

passing the second input signal through an NMOS pass-gate having a first threshold voltage, only if the select signal is in a second state; and compensating for said threshold voltage differences between said PMOS and NMOS pass-gates such that an output voltage range is substantially unaffected by whether said signal is passed through said PMOS pass-gate or through said NMOS pass-gate.

6. The method of claim 5, wherein said PMOS pass-gate is a first PMOS transistor having a gate connected to said select input line and wherein said step of passing said first input signal through a PMOS pass-gate comprises the steps of:

applying said select signal to said gate of said first PMOS transistor; and applying said first input signal to an input of said first PMOS transistor; and wherein said NMOS pass-gate is a first NMOS transistor having a gate connected to said select input line and wherein said step of passing said second input signal through a second pass-gate comprises the steps of:

applying said select signal to said gate of said first NMOS transistor; and applying said second input signal to an input of said first NMOS transistor.

7. The method of claim 6, wherein said step of compensating for voltage differences comprises the steps of:

applying an output of said first PMOS transistor to the gates of a second PMOS transistor, wherein said second PMOS transistor has a source, connected to a high voltage source, and a drain connected to an output line;

applying the output of said first PMOS transistor to the gates of a second NMOS transistor, wherein said second NMOS transistor has a drain connected to the output line, and a source connected to a ground;

applying said select signal to a third NMOS transistor, wherein said third NMOS transistor has a drain connected to said output line and a source; and applying said second input signal to a fourth NMOS transistor, wherein said fourth NMOS transistor has a drain connected to the source of said third NMOS transistor and a drain connected to a ground.

8. The method of claim 6, wherein said step of scaling said signal comprises the steps of:

applying said first input signal to a gate of a second PMOS transistor, said second PMOS transistor having a source connected to a high voltage source, and a drain;

applying said select signal to a gate of a third PMOS transistor, said third PMOS transistor having a source, connected to said drain of said second PMOS transistor, and a drain;

applying an output of said first PMOS transistor to a gate of a fourth PMOS transistor, said fourth PMOS transistor having a source, connected to said high voltage source, and a drain;

applying an output of said first NMOS transistor to a gate of a second NMOS transistor, said second NMOS transistor having a source connected to a ground, and a drain connected to said drains of said third and fourth PMOS transistors;

applying said drains of said third and fourth PMOS transistors and said second NMOS transistor to a base of a bipolar transistor, said bipolar transistor having a collector connected to said high voltage source, and an emitter connected to an output line; and applying said output of said first NMOS transistor to a gate of a third NMOS transistor, said third NMOS transistor having a source connected to a ground and a drain connected to the output line.

* * * * *

UNITED STATES PATENT AND TRADEMARK OFFICE
CERTIFICATE OF CORRECTION

PATENT NO. : 5,376,829
DATED : December 27, 1994
INVENTOR(S) : Rogerst et al.

It is certified that error appears in the above-identified patent and that said Letters Patent is hereby corrected as shown below:

In column 9, claim 5 at line 64, please delete " a first " and insert -- a second --.

Signed and Sealed this

Twenty-fifth Day of May, 1999

Attest:

Q. TODD DICKINSON

Attesting Officer      Acting Commissioner of Patents and Trademarks